US008902649B2

(12) United States Patent
Ryu

(10) Patent No.: US 8,902,649 B2
(45) Date of Patent: Dec. 2, 2014

(54) NONVOLATILE MEMORY DEVICE AND RELATED METHOD OF OPERATION

(75) Inventor: Jun-Kil Ryu, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 174 days.

(21) Appl. No.: 13/598,960

(22) Filed: Aug. 30, 2012

(65) Prior Publication Data

US 2013/0114354 A1   May 9, 2013

(30) Foreign Application Priority Data

Nov. 8, 2011   (KR) .................. 10-2011-0115737

(51) Int. Cl.
*G11C 11/56* (2006.01)
*G11C 16/04* (2006.01)

(52) U.S. Cl.
CPC .... *G11C 11/5628* (2013.01); *G11C 2211/5621* (2013.01); *G11C 16/04* (2013.01); *G11C 2211/5643* (2013.01); *G11C 2211/5648* (2013.01); *G11C 2211/5641* (2013.01)
USPC ............ 365/185.03; 365/230.02; 365/185.09; 365/230.03

(58) Field of Classification Search
CPC ........... G11C 11/5628; G11C 11/5642; G11C 11/5621; G11C 16/0483; G11C 2211/5621
USPC .............. 365/185.03, 230.02, 185.09, 230.03
See application file for complete search history.

(56) References Cited

U.S. PATENT DOCUMENTS

| | | | |
|---|---|---|---|
| 6,516,380 B2 | 2/2003 | Kenchammana-Hoskote et al. | |
| 7,970,981 B2 | 6/2011 | Cheon et al. | |
| 7,987,315 B2 | 7/2011 | Lee et al. | |
| 8,027,194 B2 * | 9/2011 | Lee et al. ................. | 365/185.03 |
| 2009/0094391 A1 | 4/2009 | Yim | |
| 2011/0219180 A1 | 9/2011 | Cheon et al. | |

FOREIGN PATENT DOCUMENTS

| | | |
|---|---|---|
| JP | 2000-173281 | 6/2000 |
| KR | 100706808 B1 | 4/2007 |
| KR | 100771521 B1 | 10/2007 |
| KR | 1020090034629 A | 4/2009 |

* cited by examiner

*Primary Examiner* — Jason Lappas
(74) *Attorney, Agent, or Firm* — Volentine & Whitt, PLLC

(57) ABSTRACT

A memory device comprises a nonvolatile memory device and a controller. The nonvolatile memory comprises a first memory area comprising single-bit memory cells and a second memory area comprising multi-bit memory cells. The controller is configured to receive a first unit of write data, determine a type of the first unit of write data, and based on the type, temporarily store the first unit of write data in the first memory area and subsequently migrate the temporarily stored first unit of write data to the second memory area or to directly store the first unit of write data in the second memory area, and is further configured to migrate a second unit of write data temporarily stored in the first memory area to the second memory area where the first unit of write data is directly stored in the second memory area.

15 Claims, 15 Drawing Sheets

NONVOLATILE MEMORY DEVICE AND RELATED METHOD OF OPERATION

CROSS-REFERENCE TO RELATED APPLICATIONS

This application claims priority under 35 U.S.C. §119 to Korean Patent Application No. 10-2011-0115737 filed on Nov. 8, 2011, the subject matter of which is hereby incorporated by reference.

BACKGROUND OF THE INVENTION

The inventive concept relates generally to electronic memory technologies. More particularly, the inventive concept relates to nonvolatile memory devices and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory include mask read only memory (MROM), programmable read only memory (PROM), erasable programmable read only memory (EPROM), and electrically erasable programmable read only memory (EEPROM).

Some nonvolatile memory devices are capable of storing more than one bit of data per memory cell. Such nonvolatile memory devices are commonly referred to as multi-bit nonvolatile memory devices or multi-level cell (MLC) nonvolatile memory devices. Nonvolatile memory devices that store more than one bit of data per memory cell may provide higher storage capacity than those that store only one bit of data per memory cell. However, they may suffer from slower operation and reduced reliability, among other things. Accordingly, researchers are engaged in ongoing efforts to improve these and other performance aspects of MLC nonvolatile memory devices.

SUMMARY OF THE INVENTION

According to one embodiment of the inventive concept, a memory device comprises a nonvolatile memory and a controller. The nonvolatile memory device comprises a first memory area comprising first memory cells configured to store single-bit data and a second memory area comprising second memory cells configured to store multi-bit data. The controller is configured to receive a first unit of write data, determine a type of the first unit of write data, and based on the type, temporarily store the first unit of write data in the first memory area and subsequently migrate the temporarily stored first unit of write data to the second memory area or to directly store the first unit of write data in the second memory area, and is further configured to migrate a second unit of write data temporarily stored in the first memory area to the second memory area where the first unit of write data is directly stored in the second memory area.

According to another embodiment of the inventive concept, a method is provided for controlling a nonvolatile memory comprising a first memory area having first memory cells configured to store single-bit data and a second memory area having second memory cells configured to store multi-bit data. The method comprises temporarily storing a first unit of write data from a controller to the first memory area according to a type of the first unit of write data, migrating the temporarily stored first unit of write data to the second memory area, and directly storing a second unit of write data from the controller to the second memory area according to a type of the second unit of write data. In this method, migrating the first unit of write data comprises migrating the temporarily stored first write unit to the second memory area when the second write unit is directly stored.

According to still another embodiment of the inventive concept, a method is provided for operating a memory system. The method comprises receiving a first unit of write data in a controller, determining a type of the first unit of write data, upon determining that the type of the first unit of write data is a first type, temporarily storing the first unit of write data from the controller to a first memory area comprising single-bit memory cells and subsequently migrating the temporarily stored first unit of write data to a second memory area comprising multi-bit memory cells, and upon determining that the type of the first unit of write data is a second type, storing the first unit of write data directly from the controller to a second memory area comprising multi-bit memory cells, and concurrently migrating a second unit of write data temporarily stored in the first memory area to the second memory area.

These and other embodiments of the inventive concept can potentially improve various aspects of memory performance, such as operating speed and throughput.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, where a feature is referred to as being "connected" or "coupled" to another feature, it can be directly connected or coupled to the other feature or intervening features may be present. Terms such as "comprises" and/or "comprising," or "includes" and/or "including" indicate the presence of stated features but do not preclude the presence or addition of other features.

Figure 1:
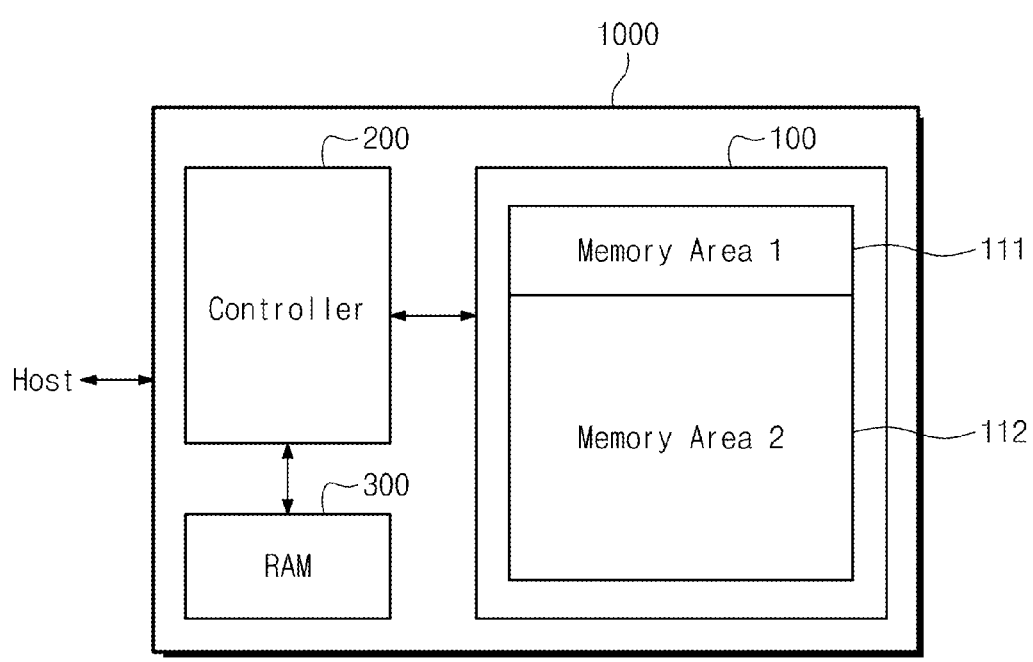
FIG. 1 is a block diagram illustrating a memory system according to an embodiment of the inventive concept.

FIG. 1 is a block diagram of a memory system 1000 according to an embodiment of the inventive concept.

Referring to FIG. 1, memory system 1000 comprises a nonvolatile memory device 100, a controller 200 and a RAM 300. Nonvolatile memory device 100 comprises a first memory area 111 and a second memory area 112. Nonvolatile memory device 100 is configured to store write data received from controller 200 in second memory area 112.

First memory area 111 and second memory area 112 each comprise a plurality of nonvolatile memory cells. The number of bits stored in memory cells of second memory area 112 is larger than the number of bits stored in memory cells of first memory area 111. For instance, each of the memory cells of first memory area 111 may store single-bit data and each of the memory cells of second memory area 112 may store multi-bit data.

The access speed a memory area where memory cells store single-bit data is generally higher than that of a memory area where memory cells store multi-bit data. Accordingly, the access speed of first memory area 111 is higher than that of second memory area 112. For instance, programming and read speeds of first memory area 111 are higher than those of second memory area 112. Although this description assumes that memory cells in first memory area 111 store single-bit data and memory cells in second memory area 112 store multi-bit data. However, the inventive concept is not limited to these conditions.

Controller 200 is coupled to nonvolatile memory device 100 and RAM 300. Controller 200 controls various operations of memory system 1000. For example, in response to a request from a host, controller 200 accesses nonvolatile memory device 100. Moreover, controller 200 generally controls read, program, erasure and background operations of nonvolatile memory device 100. Controller 200 also provides an interface between nonvolatile memory device 100 and the host, and it drives firmware for controlling nonvolatile memory device 100.

Controller 200 comprises a flash translation layer (FTL). Controller 200 receives a logical address and a unit of write data from the host when receiving a write request. Controller 200 identifies a physical address corresponding to the logical address using the FTL. Controller 200 provides a control signal CTRL indicating a physical address, a unit of write data and a program operation to nonvolatile memory device 100. Nonvolatile memory device 100 stores write data in an area indicated by the physical address. Controller 200 operates an address mapping table to manage an address mapping operation. The address mapping table is typically stored in RAM 300.

Controller 200 stores write data received from the host in second memory area 112. Controller 200 uses first memory area 111 as a write buffer. Controller 200 temporarily stores the write data in first memory area 111 according to types, or classifications, of the write data. Thereafter, controller 200 migrates, or transfers, the temporarily stored write data to second memory area 112. Controller 200 directly stores the write data in second memory area 112 according to types, or classifications, of the write data.

Upon receiving a write request, controller 200 temporarily stores a unit of write data from the host in first memory area 111 or directly stores the write data from the host in second memory area 112. After the write data is stored in first memory area 111 or second memory area 112, controller 200 transmits a signal to the host to indicate completion of a write operation. The time required to store the write data in first memory area 111 is shorter than a time required to store the write data in second memory area 112. Thus, a write request from the host is more quickly processed when the write data is stored in first memory area 111 than when it is stored in second memory area 112. Accordingly, the host more quickly receives the signal indicating completion of the write operation.

A migration operation transfers the write data temporarily stored in first memory area 111 to RAM 300 and then stores the loaded write data in second memory area 112.

RAM 300 is used as a working memory of controller 200, a buffer memory between second memory area 112 and the host, and a buffer memory for migrating data temporarily stored in first memory area 111 to second memory area 112.

Controller 200 loads write data temporarily stored in first memory area 111 to RAM 300. The write data loaded to RAM 300 is stored in second memory area 112. The write data loaded to RAM 300 may be migrated to second memory area 112 by controller 200 while nonvolatile memory device 100 is not being accessed by an external device. Also, the write data loaded on RAM 300 may be migrated to second memory area 112 by controller 200 while nonvolatile memory device 100 is not being accessed by an external device. Controller 200 may store the write data loaded to RAM 300 in second memory area 112 when directly storing write data from an external device in second memory area 112.

In some embodiments, a migration operation of write data temporarily stored in first memory area 111 is performed not only during an idle time of nonvolatile memory device 100 but also during a busy time of nonvolatile memory device 100. Thus, the migration operation may be performed without significantly slowing the performance of nonvolatile memory device 100. Moreover, storage space of first memory area 111 may be maintained efficiently and memory system 1000 may quickly process write requests from the host.

Figure 2:
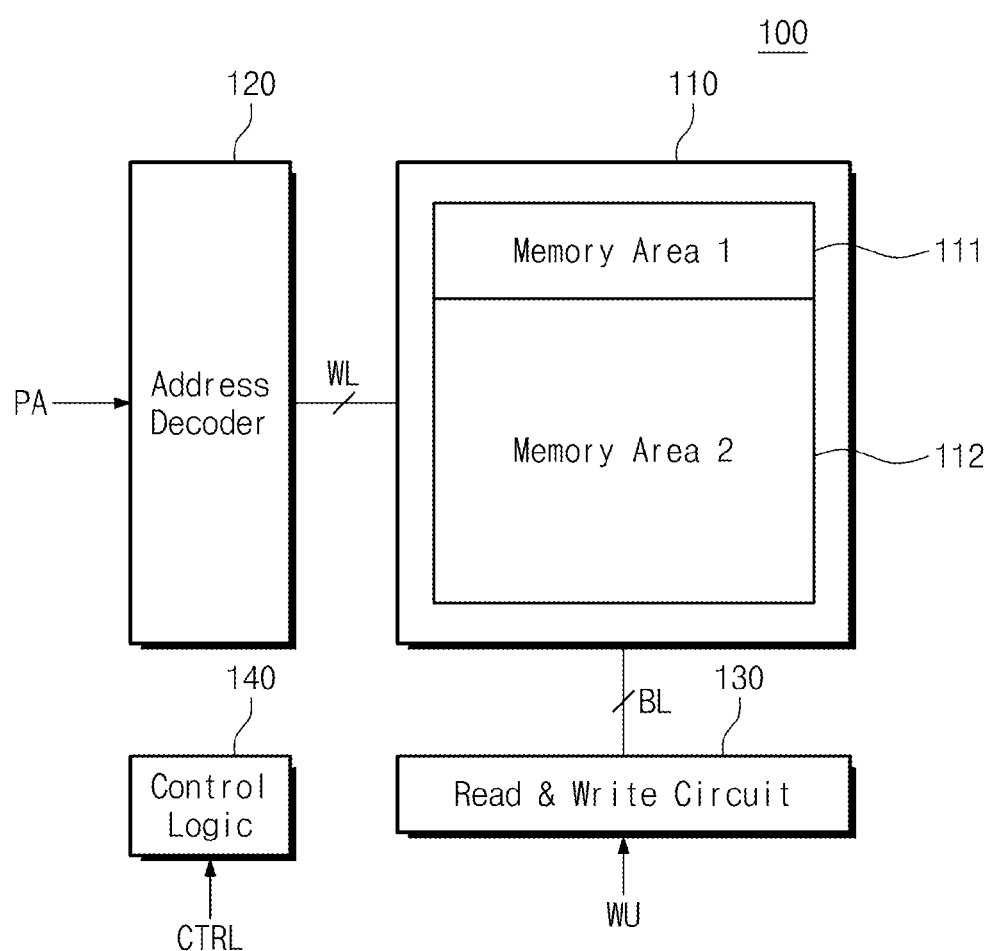
FIG. 2 is a block diagram illustrating a nonvolatile memory device in the memory system of FIG. 1 according to an embodiment of the inventive concept.
Figure 3:
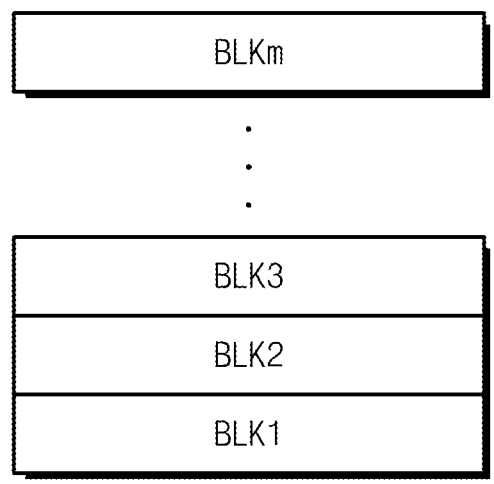
FIG. 3 is a block diagram illustrating a second memory area in the nonvolatile memory device of FIG. 2 according to an embodiment of the inventive concept.

FIG. 2 is a block diagram of nonvolatile memory device 100 according to an embodiment of the inventive concept. FIG. 3 is a block diagram of second memory area 112 according to an embodiment of the inventive concept.

Referring to FIG. 2, nonvolatile memory device 100 comprises a memory cell array 110, an address decoder 120, a read/write circuit 130 and control logic 140.

Memory cell array 110 is coupled to address decoder 120 through wordlines WL and is coupled to read/write circuit 130 through bitlines BL. Memory cell array 110 comprises first memory area 111 and second memory area 112. Each of the memory areas comprises a plurality of memory cells. Memory cells arranged in a row direction are connected to wordlines WL and memory cells arranged in a column direction are connected to the bitline BL.

Each of first memory area 111 and second memory area 112 comprises a plurality of memory blocks. Referring to FIG. 3, second memory area 112 comprises a plurality of memory blocks BLK1~BLKm. Each memory block comprises a plurality of memory cells. Memory cells arranged in a row direction in each block constitute at least one page. Memory cells in second memory area 112 store multi-bit data. Accordingly, memory cells arranged in a row direction in second memory area 112 constitute a plurality of pages.

Like second memory area 112, first memory area 111 comprises a plurality of memory blocks. Memory cells in first memory area 111 store single-bit data. Accordingly, memory cells arranged in a row direction in first memory area 111 constitute one page.

A program operation and a read operation of nonvolatile memory device 100 are performed by page unit, and an erase operation is performed by block unit.

Address decoder 120 operates under control of control logic 140. Address decoder 120 receives a physical address PA from controller 200, and it decodes a block address based on physical address PA. According to the block address, at least one memory block is selected. Address decoder 120 also decodes a row address from physical address PA. Address decoder 120 selects a wordline corresponding to the decoded row address. Address decoder 120 selects a line corresponding to the row address by applying different voltages to the selected wordline and unselected wordlines. Address decoder 120 also decodes a column address from physical address PA and transmits the decoded column address to read/write circuit 130.

Address decoder 120 comprises a row decoder that decodes a row address, a column decoder that decodes a column address and a physical buffer storing physical address PA.

Read/write circuit 130 is coupled to memory cell array 110 through bitlines BL. Read/write circuit 130 operates under control of control logic 140.

Read/write circuit 130 receives a unit of write data WD from controller 120. In a program operation, read/write circuit 130 programs write data WD in memory cells connected to the selected wordline. In a read operation, read/write circuit 130 reads data stored in the memory cells of the selected wordline. Read/write circuit 130 receives the decoded column address from address decoder 120. Read/write circuit 130 outputs data corresponding to the decoded column address among the read data. The output data is transmitted to controller 200.

Read/write circuit 130 typically comprises features such as a page buffer (or page register), a column select circuit, or a data buffer. Read/write circuit 130 typically comprises features such as a sense amplifier, a write driver, a column select circuit, or a data buffer.

Control logic 140 is connected to address decoder 120 and read/write circuit 130. Control logic 140 controls operations of nonvolatile memory device 100 in response to control signal CTRL received from controller 200.

Figure 4:
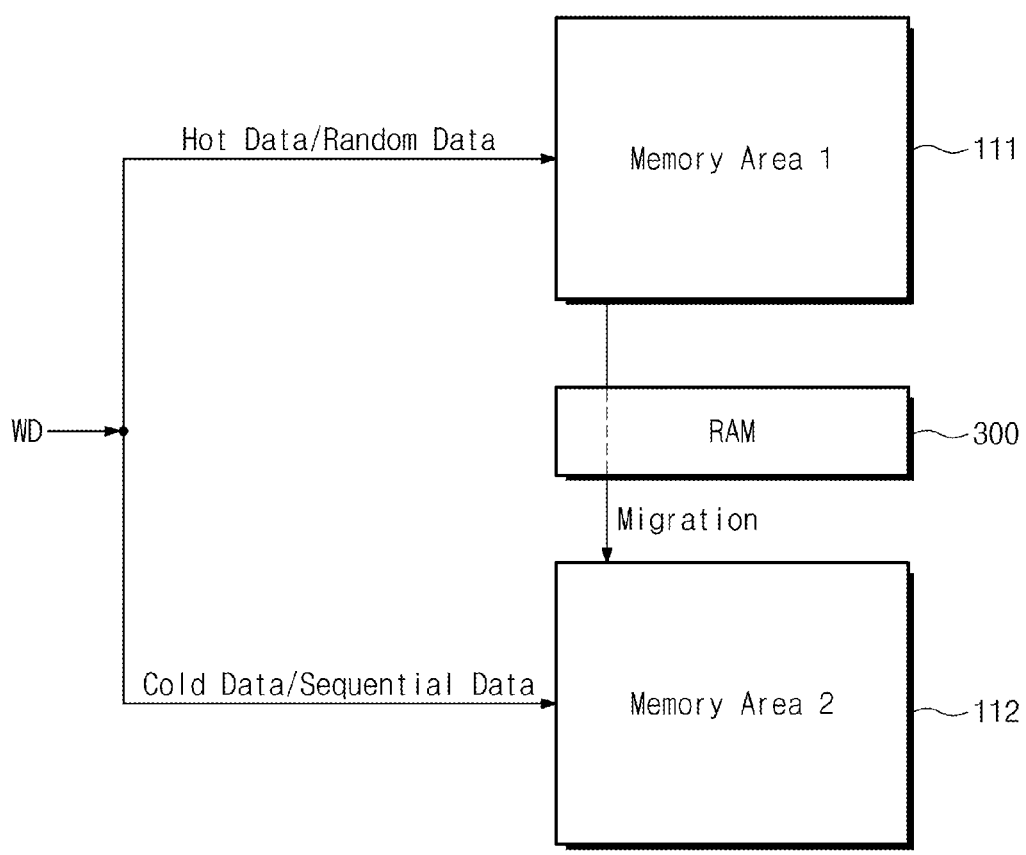
FIG. 4 is a diagram illustrating a method of programming data in the second memory area of FIG. 3 according to an embodiment of the inventive concept.

FIG. 4 is a diagram illustrating a method of programming write data in second memory area 112 according to an embodiment of the inventive concept.

Referring to FIGS. 1 and 4, the method programs a unit of write data WD in a manner determined according to a type of write data WD. For example, write data WD received from the host may be directly stored in second memory area 112. Also, write data WD received from the host may be temporarily stored in first memory area 111. An area in which write data WD is stored is determined according to physical address PA received from controller 200. Write data WD temporarily stored in first memory area 111 may be migrated to second memory area 112. As illustrated in FIG. 4, write data WD temporarily stored in first memory area 111 is loaded on RAM 300 and write data WD loaded on RAM 300 is stored in second memory area 112.

Controller 200 temporarily stores write data WD in first memory area 111 or stores write data WD in second memory area 112 according to a type of write data WD.

Write data WD temporarily stored in first memory area 111 constitutes "hot data" and write data WD stored in second memory area 112 constitutes "cold data". The hot data has a logical address that is frequently accessed by the host and the cold data has a logical address that is not frequently accessed by the host.

Whether write data WD is hot data or cold data may be determined by various methods. Controller 200 stores a table including count values corresponding to logical address values respectively in RAM 300 and increases the corresponding count value whenever the logical address and write data WD are received (whenever receiving a write request). Controller 200 determines whether the write data WD is hot data or cold data according to each count value.

Controller 200 may divide the logical address values into multiple groups and stores a table comprising count values corresponding to the groups in RAM 300. Whenever the logical address and write data WD are received, controller 200 increases a count value of a group including the received logical address value. Controller 200 determines whether the write data WD is hot data or cold data according to each count value. Besides that method, controller 200 may determine whether the corresponding write data WD is hot data or cold data according to various methods.

Write data WD temporarily stored in first memory area 111 is random data and write data WD being stored in second memory area 112 is sequential data. The sequential data is comparatively large data and the random data is comparatively small data. Whether write data WD is sequential data or random data may be determined by various methods. Controller 200 determines a type of write data WD according to a logical address received in conjunction with a write request from the host. A logical address received when one write request occurs indicates an address area having sequentially increasing values. When receiving a write request, a beginning value of logical address and size information of logical address are provided from the host together with data to be stored and thereby an address area which the logical address indicates may be specified. Controller 200 determines whether write data WD is random data or sequential data according to a size of the address area.

Controller 200 determines a method of storing write data WD according to a type of write data WD. When write data WD is hot data and random data, controller 200 may temporarily store write data WD in first memory area 111 and may migrate the temporarily stored write data WD to second memory area 112. When write data WD is at least one of cold data and sequential data, controller 200 directly stores write data WD in second memory area 112. When write data WD is at least one of hot data and random data, controller 200 may temporarily store write data WD in first memory area 111 and may migrate the temporarily stored write data WD to second memory area 112. When write data WD is cold data and sequential data, controller 200 directly stores write data WD in second memory area 112.

Figure 5:
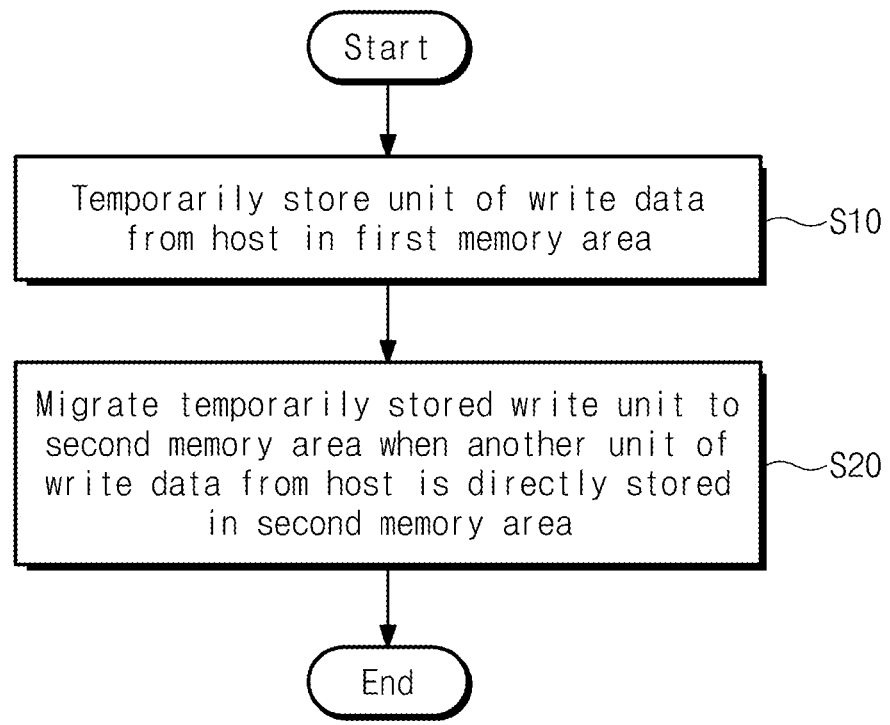
FIG. 5 is a flowchart illustrating a method of operating the memory device of FIG. 1 according to an embodiment of the inventive concept.

FIG. 5 is a flowchart showing an operation method of the memory device of FIG. 1. Referring to FIG. 5, in S10, a unit of write data received from the host is temporarily stored in first memory area 111. In S20, when another unit of write data received from the host is directly in second memory area 112, the write data stored in first memory area 111 migrates to second memory area 112. Where write data is received from the host, controller 200 determines whether to temporarily store the write data in first memory area 111 or to store the write data in second memory area 112 according to a type of the received write data. When storing the write data in second memory area 112, controller 200 may store the write dat temporarily stored in first memory area 111 in second memory area 112.

Figure 6:
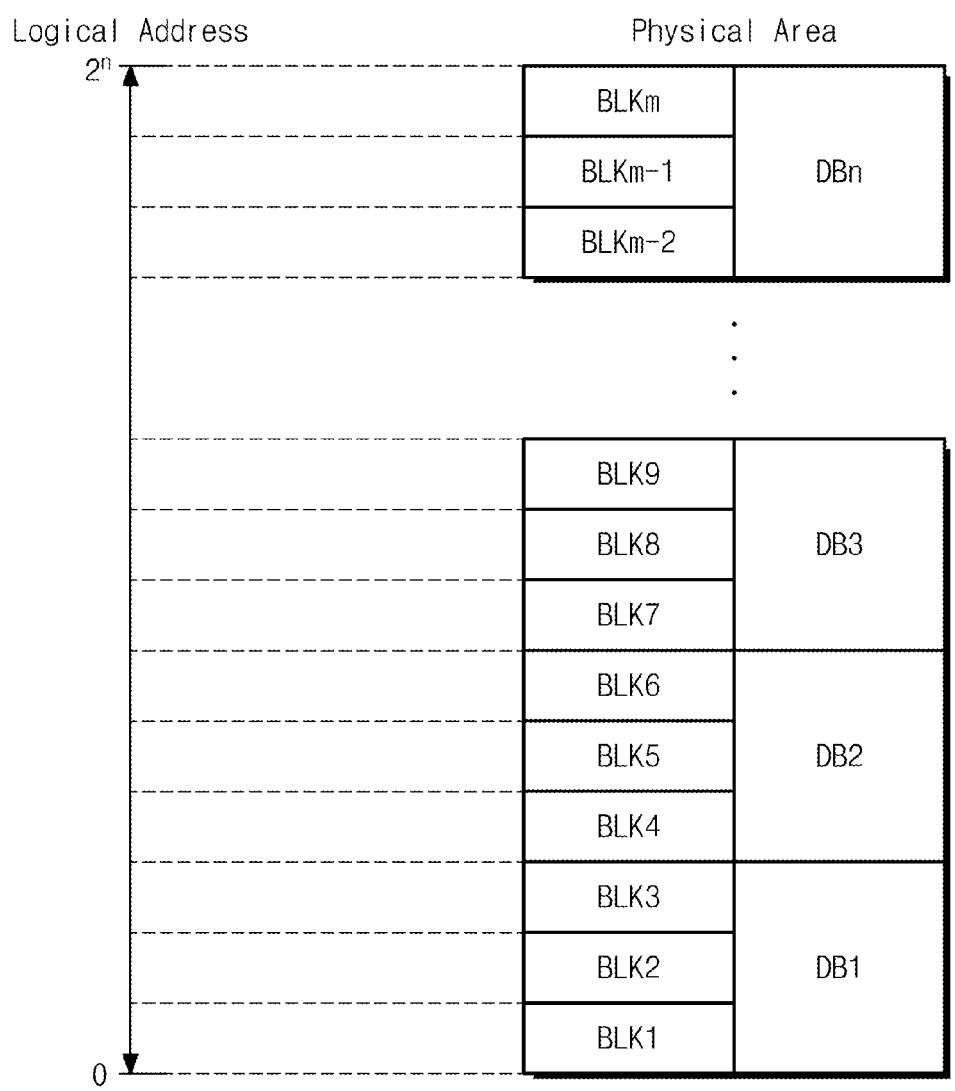
FIG. 6 is a diagram illustrating a relationship between logical addresses received from a host and corresponding physical areas in the second memory area of FIG. 2 according to an embodiment of the inventive concept.

FIG. 6 is a drawing illustrating a relationship between logical addresses received from the host and a corresponding physical areas of second memory area 112 according to an embodiment of the inventive concept.

Referring to FIG. 6, a logical address space comprises addresses from 0 to $2^n$. Memory blocks BLK1~BLKm correspond to data blocks DB1~DBn, and one data block corresponds to at least one memory block. In FIG. 6, one data block corresponds to three memory blocks.

Figure 7:
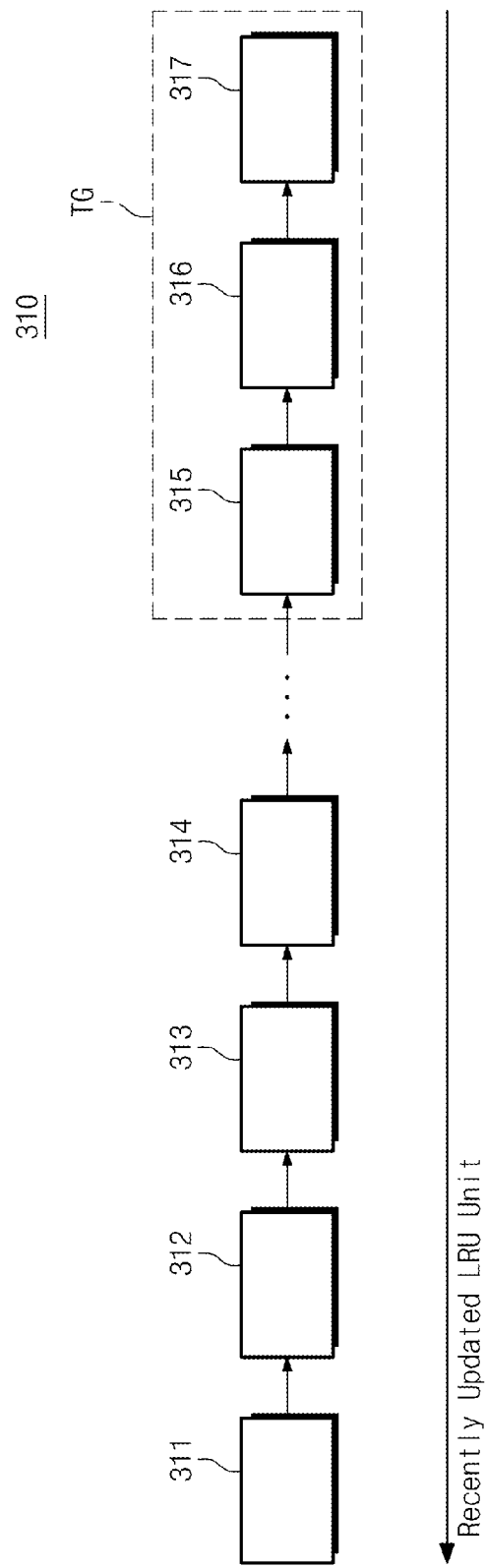
FIG. 7 is a diagram illustrating a least recently used (LRU) table stored in a RAM in the memory system of FIG. 1 according to an embodiment of the inventive concept.

FIG. 7 is a diagram illustrating a least recently used (LRU) table 310 stored in RAM 300 of FIG. 1 according to an embodiment of the inventive concept.

Referring to FIG. 7, LRU table 310 comprises a plurality of LRU units 311~317. LRU table 310 is managed by LRU unit. LRU table 310 is driven on RAM 300 and is operated by controller 200. Each LRU unit is an element for indicating one data block. Each LRU unit indicates data block connected with the write data temporarily stored in first memory area 111 among the data blocks of second memory area 112.

Where write data WD received from the host is temporarily stored in first memory area 111, LRU table 310 is updated. Where write data WD is received from the host, controller 200 determines a memory block corresponding to a logical address of write data WD temporarily stored on the basis of the address mapping table. Controller 200 determines a data block including the determined memory block. The LRU unit corresponding to the determined data block is updated to LRU table 310. The updated LRU unit is included in a head of LRU table 310. The head of LRU table 310 is a most recent updated LRU unit.

Where the LRU unit corresponding to the determined data block is already included in LRU table 310, the LRU unit may be included in LRU table 310 as a head of LRU table 310.

LRU table 310 comprises information indicating the order in which LRU units 311~317 are updated. That is, the LRU units 311~317 are linked in the order of their update time. In FIG. 7, first LRU unit 311 corresponds to the data block of write data WD most recently and temporarily stored in first memory area 111. Seventh LRU unit 317 corresponds to the data block of write data WD first temporarily stored in first memory area 111. First through seventh LRU units 311~317 are sequentially arranged in the order in which they are recently updated.

Each LRU unit comprises location information of the temporarily stored write data WD in first memory area 111. Each LRU unit comprises information such as a logical address of the temporarily stored write data WD, a physical address corresponding to the logical address and a mapping relationship between the physical address and the logical address.

Among LRU units 311~317, a specific number of LRU units that are earliest-updated are selected as a target group TG. The number of LRU units selected as target group TG may be variously changed. In FIG. 7, three LRU units 315~317 are selected as target group TG.

Hereinafter, data blocks corresponding to LRU units 315~317 of target group TG will be referred to as selected data blocks. Controller 200 loads write data corresponding to the selected data block among the write data temporarily stored in first memory area 111 onto RAM 300.

Referring again to FIG. 1, controller 200 may directly store a unit of write data in second memory area 112 according to a type of the write data, such as whether it is cold data or sequential data. In some embodiments, where the write data received from the host is to be directly stored in second memory area 122, controller 200 may determine whether a data block in which the write data is to be stored coincides with any one of the selected data blocks. If so, a unit of write data corresponding to the selected data block among the write data loaded onto RAM 300 is stored in the selected data block together with the write data received from the host.

Figure 8:
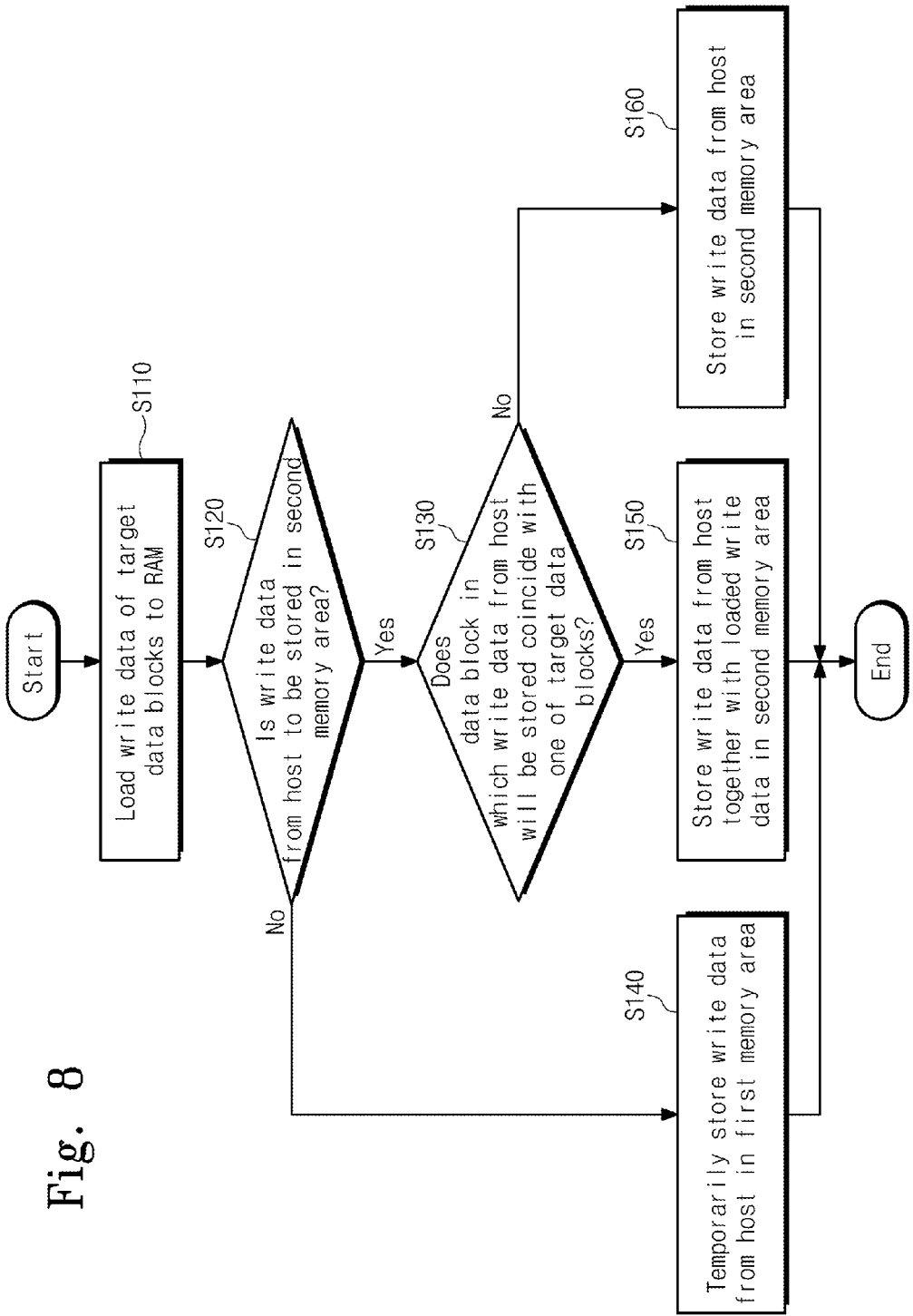
FIG. 8 is a flowchart illustrating an operation performed in the method of FIG. 5 according to an embodiment of the inventive concept.

FIG. 8 is a flowchart illustrating operation S20 performed in the method of FIG. 5 according to an embodiment of the inventive concept.

Referring to FIGS. 1, 7 and 8, units of write data corresponding to the selected data blocks among the write data in first memory area 111 are loaded onto RAM 300 (S110). Each LRU unit comprises address information indicating a location of the write data temporarily stored in first memory area 111. On the basis of information stored in the LRU units of target group TG, controller 200 determines addresses of the write data corresponding to the selected data blocks. According to the determined addresses, controller 200 reads the write data corresponding to the selected data blocks from first memory area 111 and stores the read write data in RAM 300.

Thereafter, upon determining that another unit of write data is received from the host, controller 200 determines whether the write data from the host is to be stored in second memory area 112 (S120). Where the write data received from the host is cold data or sequential data, controller 200 directly stores the write data received from the host in second memory area 112. Where the write data received from the host is to be stored in second memory area 112 (S120=Yes), the method proceeds to operation S130. Otherwise, where the write data received from the host is to be stored in first memory area 111 (S120=No), the method proceeds to operation S140.

In operation S130, controller 200 determines whether a data block in which the unit of write data received from the host will be stored coincides with any one of the selected data blocks. Controller 200 also determines whether the selected data blocks include a data block (hereinafter, a target data block) that coincides with the data block in which the write data received from the host is to be stored. If so (S130=Yes), the method proceeds to operation S150. Otherwise (S130=No), the method proceeds to operation S160.

Controller 200 determines a physical address corresponding to a logical address of write data received from the host by operating a flash translation layer (FTL). According to the determined physical address, controller 200 determines the data block in which the write data received from the host will be stored. Controller 200 also determines whether the target data block exists.

In operation S140, the write data received from the host is temporarily stored in first memory area 111. Controller 200 determines a data block of second memory area 112 corresponding to the write data. Controller 200 also determines the physical address corresponding to the logical address of the write data by operating the flash translation layer (FTL). According to the determined physical address, controller 200 determines a data block corresponding to the write data received from the host. Controller 200 updates the LRU unit indicating the determined data block as a head of the LRU table 310. As a result, the updated LRU unit comprises address information indicating a storage location of the write data from the host in first memory area 111.

In operation S150, a unit of write data loaded onto RAM 300 and corresponding to the target data block (hereinafter, piggyback write data) is stored in the target data block of second memory area 112 together with the write data from the host.

A mapping relation between a logical address and a physical address of the piggyback write data and a mapping relation between a logical address and a physical address of the write data from the host are managed by controller 200.

The write data from the host and the piggyback write are sequentially written in one memory block among the determined data blocks. For instance, the write data from the host and the piggyback write are programmed in a series of pages of one memory block.

Controller 200 maps a logical address and a physical address of second memory area 112 using a page mapping method, a block mapping method or a hybrid mapping method. Controller 200 operates an address mapping table to manage an address mapping operation.

The address mapping table is typically stored on RAM 300. A page mapping table is used in the page mapping method. The page mapping table is used for performing a mapping operation by a page unit. A logical address and a physical address indicating a page corresponding to the logical address are stored in the page mapping table. A block mapping table is used in the block mapping method. The block mapping table is used for performing a mapping operation by a block unit.

A logical address and a physical address indicating a memory block corresponding to the logical address are stored in the block mapping table. The hybrid mapping method uses the page mapping method and the block mapping method at the same time. For example, where the page mapping method and the hybrid mapping method are used, mapping information between a logical address of each of the write data stored in second memory area 112 and a physical address indicating a page in which the logical address may be managed.

Sequentially writing the write data from the host and the piggyback write data is possible when the page mapping method and the hybrid mapping method are used. The write data from the host is stored in a page corresponding to a physical address indicated by a logical address. The piggyback write data is stored in a page connected with a page in which the write data from the host is stored. The logical address of the piggyback write data and the physical address indicating a page in which the piggyback write data is stored are stored in the address mapping table (page mapping table or hybrid mapping table). Also, the logical address of the write data from the host and the physical address of the write data are stored in the address mapping table.

Where the piggyback write data is stored in second memory area 112, controller 200 deletes the LRU unit indicating the target data block from the LRU table 310. The piggyback write data stored in RAM 300 is deleted. LRU units included in target group TG are reset.

Among the write data in first memory area 111, write data corresponding to the selected data blocks are loaded onto RAM 300. Operation S160 is performed after determining in operation S130 that the target data block is not found among the selected data blocks. In operation S160, the write data from the host is stored in second memory area 112.

The migration operation in accordance with some embodiments of the inventive concept may be performed in a busy time of nonvolatile memory device 100. Thus, a remaining storage space of first memory area 111 may be effectively obtained.

Figure 9:
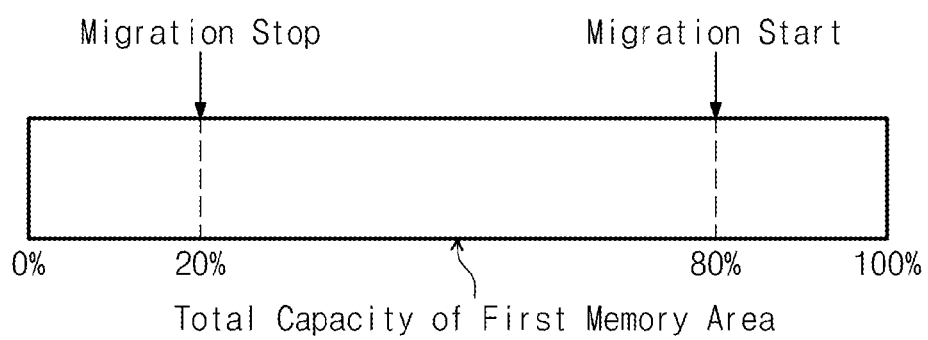
FIG. 9 is a diagram illustrating a timing of the operation illustrated in FIG. 8 according to an embodiment of the inventive concept.

FIG. 9 is a diagram illustrating a timing of the operation illustrated in FIG. 8 according to an embodiment of the inventive concept.

Referring to FIGS. 1 and 9, a migration operation is performed according to a ratio of a remaining storage capacity among the total storage capacity. As write data is temporarily stored in first memory area 111, a ratio of space in which data is stored among the total storage capacity may increase.

In some embodiments, where a ratio of space in which data of first memory area 111 is stored increases to reach a first critical value (e.g., 80%), controller 200 performs a migration operation. This migration operation is used to secure the available storage capacity of first memory area 111. The migration operation reduces the ratio of space in which data is stored among the total storage capacity of first memory area 111.

Write data determined to be hot data is stored in first memory area 111. Write data temporarily stored in first memory area 111 is likely to be renewed. In some embodiments, where a ratio of space in which data of first memory area 111 is stored decreases to a second critical value (e.g., 20%), controller 200 stops the migration operation. Thus, a ratio of space in which data is stored among the total storage capacity of first memory area 111 is maintained above the second critical value.

Figure 10:
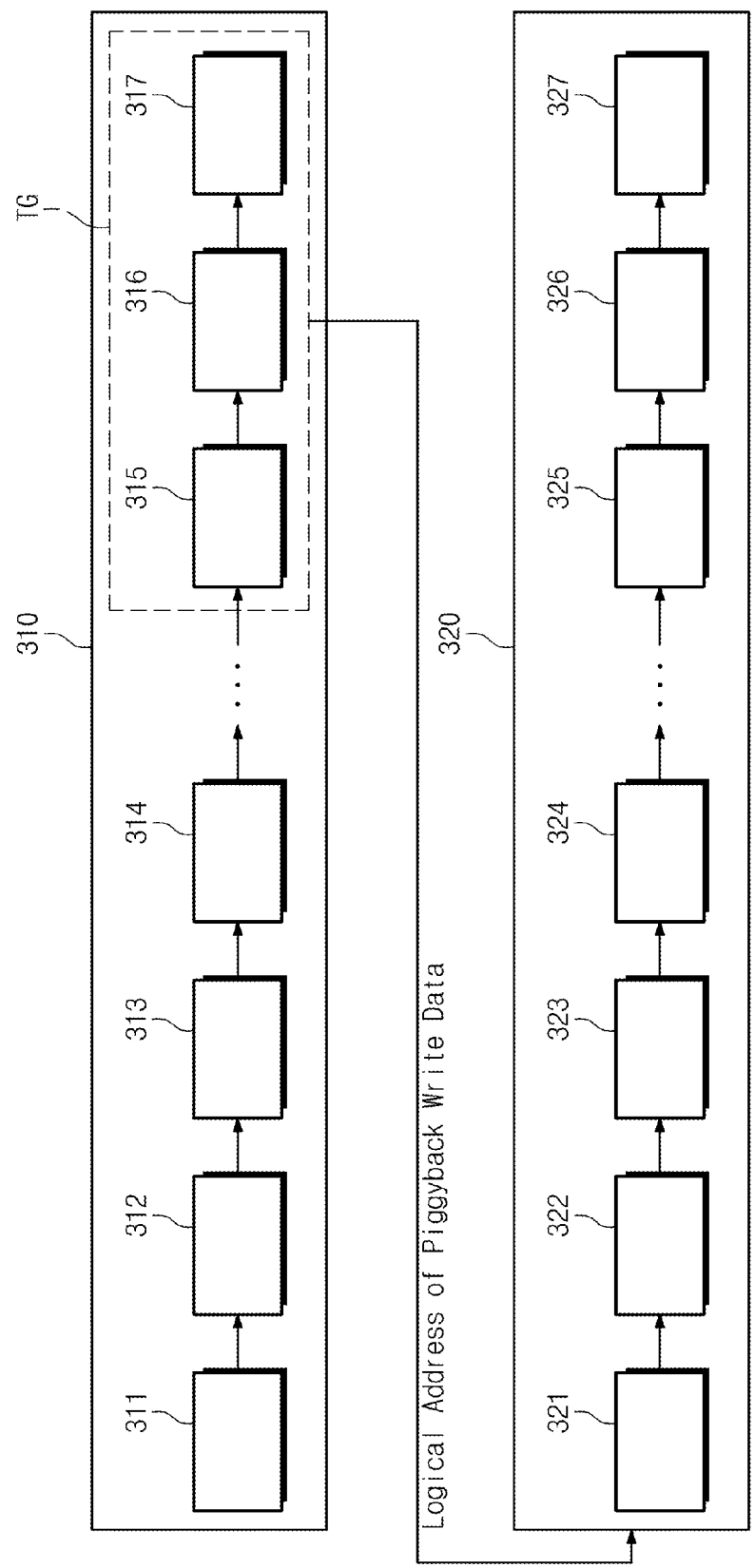
FIG. 10 is a diagram illustrating an LRU table and a sub LRU table used by a controller in the memory system of FIG. 1 according to an embodiment of the inventive concept.

FIG. 10 is a diagram illustrating LRU table 310 and sub LRU 320 table operated by controller 200 of FIG. 1 according to an embodiment of the inventive concept.

Referring to FIGS. 1 and 10, LRU table 310 and the sub LRU table 320 are stored in RAM 300. LRU table 310 is configured as described with reference to FIG. 7.

Sub LRU table 320 comprises sub LRU units 321~327. Each of sub LRU units 321~327 indicates a logical address of the piggyback write data. It is assumed that the piggyback write data is stored in the second memory unit 112, and an LRU unit corresponding to the piggyback write data is deleted from LRU table 310. Under these conditions, controller 200 updates sub LRU unit 321 indicating a logical address of the piggyback write data to a head of the sub LRU table 320. Sub LRU units 321~327 are sequentially arranged in the order in which they are recently updated. Consequently, LRU table 310 comprises information on the write data temporarily stored in first memory area 111. Sub LRU table 320 comprises information on the write data temporarily stored in first memory area 111 in the past.

On the basis of sub LRU table 320, controller 200 determines whether write data received from the host is hot data or cold data. Controller 200 determines whether sub LRU units 321~327 store a logical address of the write data received from the host. If so, the write data received from the host has been previously determined to be hot data and stored in first memory area 111, and controller 200 determines the write data received from the host to be hot data. Otherwise, controller 200 determines the write data received from the host to be cold data.

Figure 11:
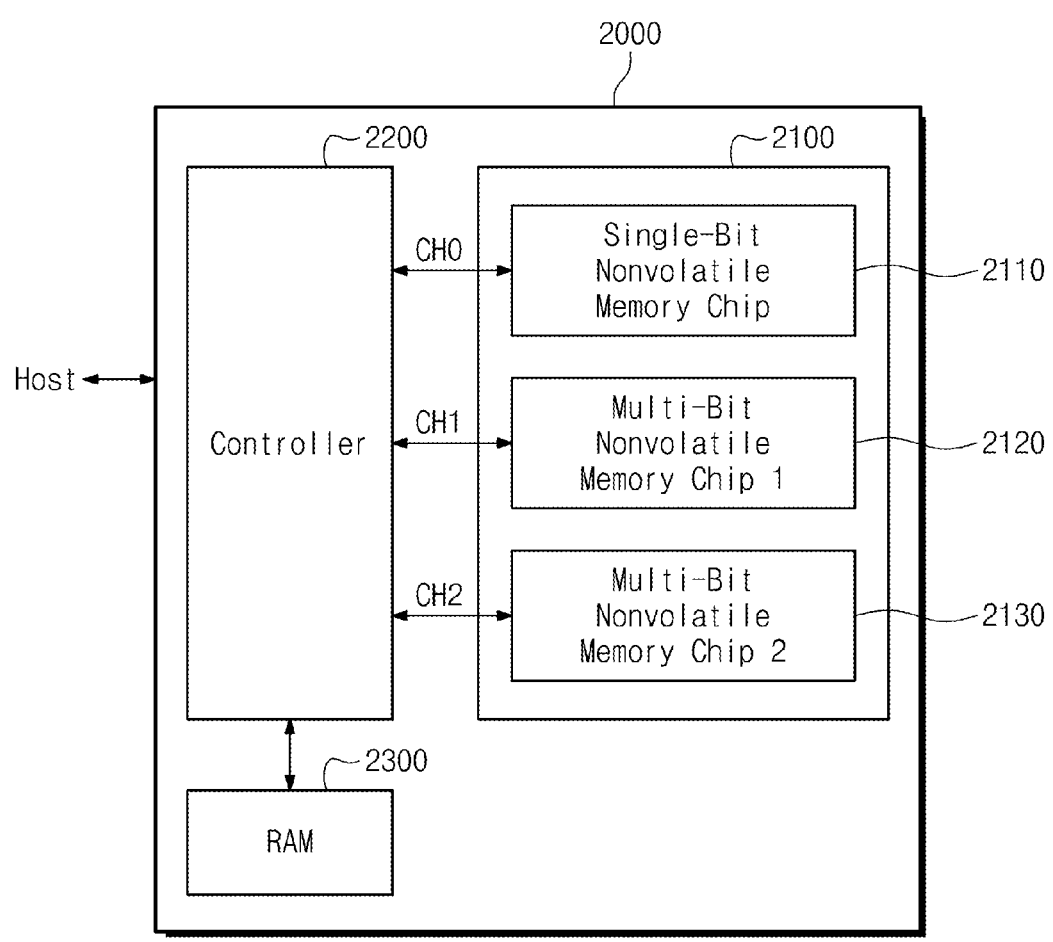
FIG. 11 is a block diagram of a memory system according to another embodiment of the inventive concept.
Figure 12:
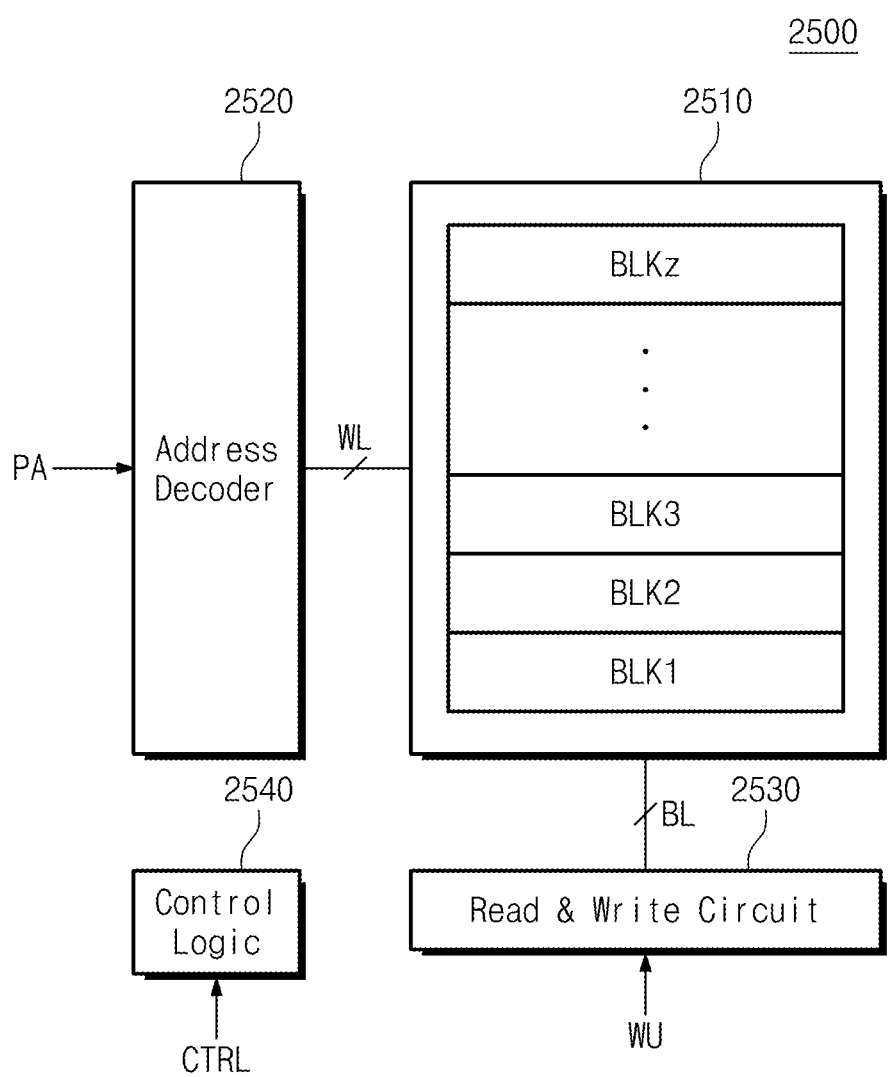
FIG. 12 is a block diagram of a memory chip in the memory system of FIG. 11 according to an embodiment of the inventive concept.

FIG. 11 is a block diagram of a memory system 2000 according to another embodiment of the inventive concept. FIG. 12 is a block diagram illustrating a memory chip in memory system 2000.

Referring to FIG. 11, memory device 2000 comprises a nonvolatile memory device 2100, a controller 2200, and a RAM 2300. Nonvolatile memory 2100 comprises a single-bit nonvolatile memory chip 2110, and first and second multi-bit nonvolatile memory chips 2120 and 2130. Memory cells in single-bit nonvolatile memory chip 2110 store single-bit data, and memory cells in first and second multi-bit nonvolatile memory chips 2120 and 2130 store multi-bit data.

Single-bit nonvolatile memory chip 2110 operates as first memory area 111, and first and second multi-bit nonvolatile memory chips 2120 and 2130 operate as second memory area 112.

Referring to FIG. 12, a nonvolatile memory chip 2500 comprises a memory cell array 2510, an address decoder 2520, a read/write circuit 2530, and control logic 2540. Address decoder 2520, read/write circuit 2530, and control logic 2540 are formed similar to address decoder 120, read/write circuit 130 and control logic 140 described with reference to FIG. 2.

Memory cell array 2510 comprises a plurality of memory blocks BLK1~BLKz. Each of memory blocks BLK1~BLKz comprises a plurality of memory cells. Memory cells in memory cell array 2510 of first multi-bit nonvolatile memory chip 2120 store multi-bit data. Memory cells in memory cell array 2510 of second multi-bit nonvolatile memory chip 2130 also store multi-bit data. Memory cells in memory cell array 2510 of single-bit nonvolatile memory chip 2110 store single-bit data.

Referring again to FIG. 11, controller 2200 is connected to nonvolatile memory 2100 and the RAM 2300. Controller 2200 is connected to single-bit nonvolatile memory chip 2110, first multi-bit nonvolatile memory chip 2120 and second multi-bit nonvolatile memory chip 2130 through zero-th through second channels CH0~CH2.

Figure 13:
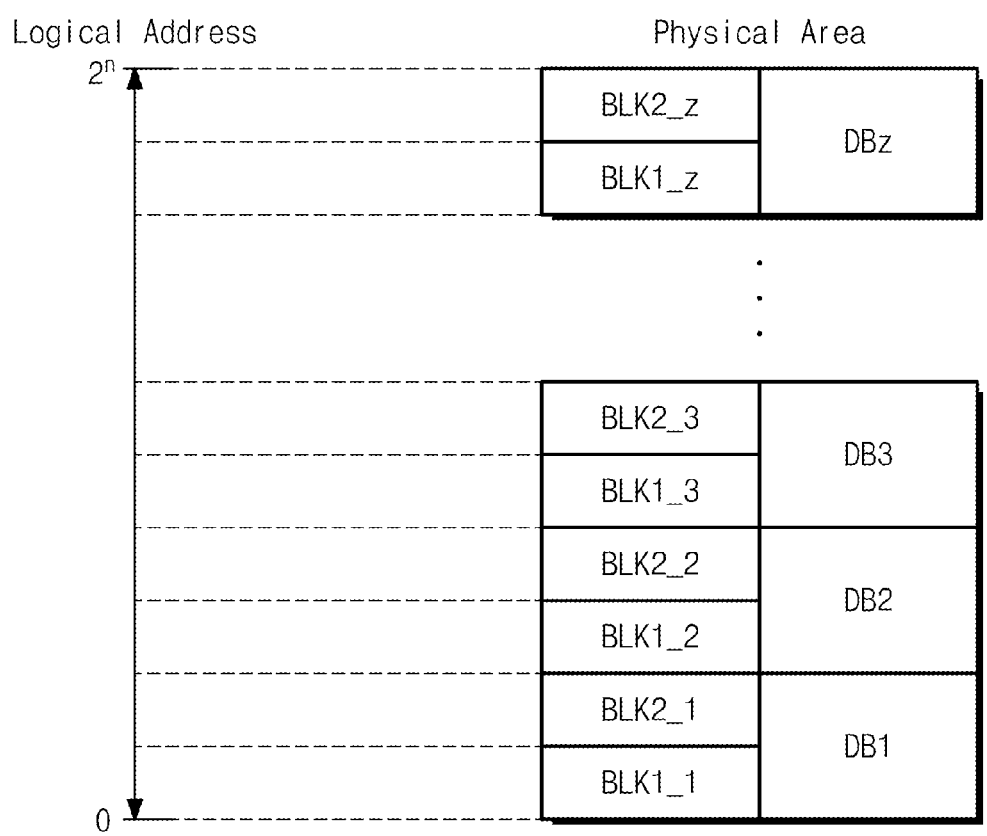
FIG. 13 is a diagram illustrating a relationship between logical addresses received from a host and corresponding physical areas in first and second multi-bit nonvolatile memory chips in the memory system of FIG. 11 according to an embodiment of the inventive concept.

FIG. 13 is a diagram illustrating a relationship between logical addresses received from a host and corresponding physical areas in first and second multi-bit nonvolatile memory chips 2120 and 2130 according to an embodiment of the inventive concept.

Referring to FIGS. 11 and 13, a memory block of first multi-bit nonvolatile memory chip 2120 and a memory block of the second multi-bit nonvolatile memory chip 2130 are included in one data block. The data block constitutes a super block.

For example, a first memory block BLK1_1 of first multi-bit nonvolatile memory chip 2120 and a first memory block BLK2_1 of second multi-bit nonvolatile memory chip 2130 are included in a first data block DB1. A z-th memory block BLK1_z of first multi-bit nonvolatile memory chip 2120 and a z-th memory block BLK2_z of second multi-bit nonvolatile memory chip 2130 are included in a z-th data block DBz.

Controller 2200 performs a program operation, a read operation, and an erase operation on each of memory blocks of one data block at the same time. A program operation can be performed on memory blocks in one data block at the same time. Data of memory blocks in one data block may be read at the same time. Data of memory blocks in one data block may be erased at the same time.

Referring again to FIG. 11, controller 2200 typically receives a unit of write data whenever a write request from the host occurs. Controller 2200 temporarily stores the write data in single-bit nonvolatile memory chip 2110 based on a type of the write data received from the host (e.g., whether the write data is hot data or random data). As multiple write requests are sequentially received from the host, multiple units of write data are temporarily stored in the single-bit nonvolatile memory chip 2110. Controller 2200 loads write data corresponding to the selected data blocks (See, e.g., target group TG of FIG. 7) among the write data temporarily stored in the single-bit nonvolatile memory chip 2110 to RAM 2300.

Controller 2200 directly stores write data in first and second multi-bit nonvolatile memory chips 2120 and 2130 based on a type of the write data received from the host, e.g., whether it is cold data or sequential data. A data block is determined which corresponds to a logical address of write data received from the host. As the data block is determined, controller 2200 determines whether a target data block exists among selected data blocks specified by target group TG. If so, controller 2200 stores piggyback write data among the write data loaded onto RAM 2300 in the target data block together with the write data received from the host.

Controller 2200 concurrently stores the write data from the host and the piggyback write data in two respective memory blocks included in the target data block. For example, the write data from the host may be stored in a memory block of first multi-bit nonvolatile memory chip 2120 and the piggyback write data may be stored in a memory block of the second multi-bit nonvolatile memory chip 2130.

Figure 14:
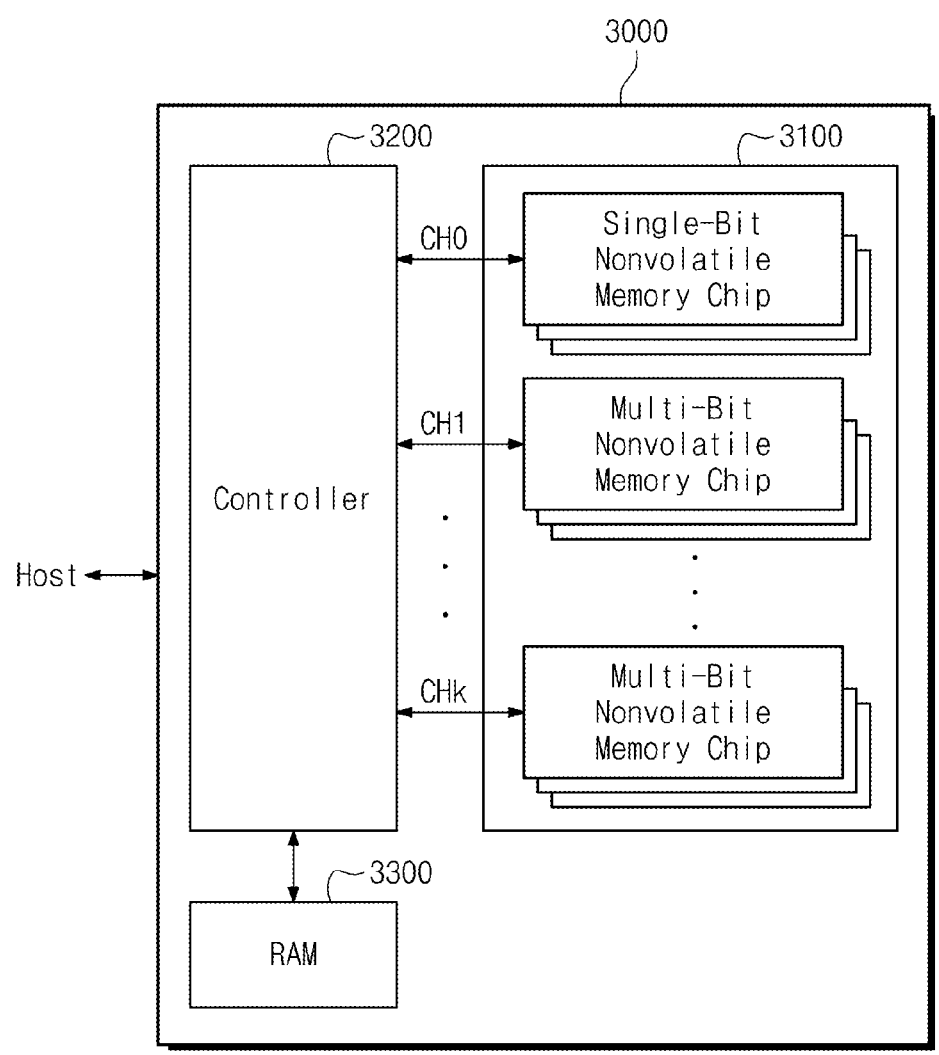
FIG. 14 is a block diagram of a memory system according to still an embodiment of the inventive concept.

FIG. 14 is a block diagram of a memory system 3000 according to still another embodiment of the inventive concept.

Referring to FIG. 14, memory system 3000 comprises a nonvolatile memory 3100, a controller 3200, and a RAM 3300. Nonvolatile memory 3100 comprises a plurality of single-bit nonvolatile memory chips and a plurality of multi-bit nonvolatile memory chips.

The single-bit nonvolatile memory chips are configured to communicate with controller 3200 through one common channel CH0. Each of the single-bit nonvolatile memory chips has substantially the same structure and functionality as single-bit nonvolatile memory chip 2110 described with reference to FIG. 11.

The multi-bit nonvolatile memory chips communicate with controller 3200 through first through kth channels CH1~CHk. The multi-bit nonvolatile memory chips are divided into a plurality of groups. Each of the groups of the multi-bit nonvolatile memory chips is configured to communicate with controller 3200 through one common channel. The multi-bit nonvolatile memory chips connected through the one common channel are selected by controller 3200. The selected multi-bit nonvolatile memory chip is configured to communicate with controller 3200 through the relevant channel. Each of the multi-bit nonvolatile memory chips has substantially the same structure and functionality as multi-bit nonvolatile memory chip 2120 or 2130 described with reference to FIG. 11.

Controller 3200 operates similar to memory controller 2200 described with reference to FIG. 11.

Figure 15:
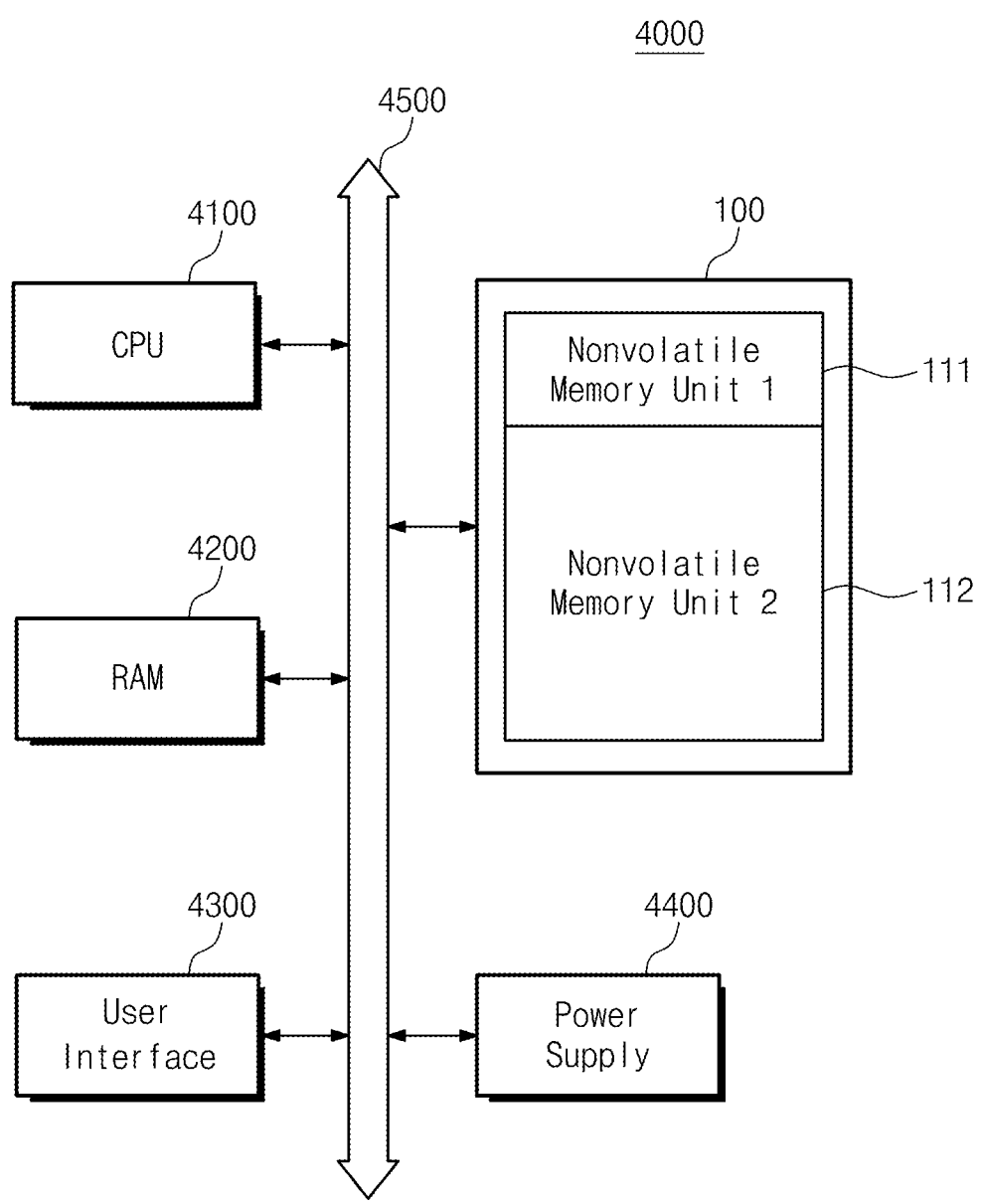
FIG. 15 is a block diagram of a computing system comprising the nonvolatile memory of FIG. 1 according to an embodiment of the inventive concept.

FIG. 15 is a block diagram of a computing system 4000 comprising the nonvolatile memory of FIG. 1 according to an embodiment of the inventive concept.

Referring to FIG. 15, computing system 4000 comprises a central processing unit (CPU) 4100, a RAM 4200, a user interface 4300, a power supply 4400, a system bus 4500 and nonvolatile memory device 100.

Nonvolatile memory device 100 is electrically connected to CPU 4100, RAM 4200, the user interface 4300 and the power supply 4400 through the system bus 4500. Data provided through the user interface 4300 or processed by CPU 4100 is stored in nonvolatile memory device 100.

Nonvolatile memory device 100 is directly connected to system bus 4500. A function of controller 200 of FIG. 1 is performed by CPU 4100. A function of RAM 300 of FIG. 1 is performed by RAM 4200.

Although FIG. 15 shows computing system 4000 comprising nonvolatile memory device 100, nonvolatile memory device 100 could be replaced by memory system 1000 of FIG. 1, for example. In addition, nonvolatile memory device 100 could be replaced by the nonvolatile memory 2100 or 3100 described with reference to FIG. 11 or 14. Moreover, computing system 4000 may be configured to include all of nonvolatile memories 100, 2100 and 3100 described with reference to FIGS. 1, 11 and 14.

In various embodiments as described above, the use of a storage space of memory area as a buffer can potentially improve the operating speed of a nonvolatile memory.

The foregoing description is not to be construed to limit the inventive concept. Those skilled in the art will readily appreciate that many modifications are possible in the described embodiments without materially departing from the novel teachings and advantages of the inventive concept. Accordingly, all such modifications are intended to be included within the scope of the inventive concept as defined in the claims.

What is claimed is:

1. A memory device, comprising:
a nonvolatile memory comprising a first memory area comprising first memory cells configured to store single-bit data and a second memory area comprising second memory cells configured to store multi-bit data; and
a controller configured to receive a first unit of write data, determine a type of the first unit of write data, and based on the type, temporarily store the first unit of write data in the first memory area and subsequently migrate the temporarily stored first unit of write data to the second memory area or to directly store the first unit of write data in the second memory area, and further configured to migrate a second unit of write data temporarily stored in the first memory area to the second memory area where the first unit of write data is directly stored in the second memory area.

2. The memory device of claim 1, wherein the second memory area comprises a plurality of data blocks having the second memory cells,
wherein each of the data blocks comprises a plurality of memory blocks, and
wherein a physical address corresponding to a logical address of the first unit of write data and a physical address corresponding to a logical address of the second unit of write data belong to one data block.

3. The memory device of claim 2, wherein the controller is configured to sequentially write the first and second units of write data in a memory block of the one data block.

4. The memory device of claim 1, wherein the second memory area comprises a plurality of memory chips having the second memory cells,
wherein the memory chips are connected to the controller through a plurality of channels, and
wherein the controller is configured to access the memory chips concurrently through the channels and to store the second unit of write data in a second memory chip among the memory chips when the first unit of write data is stored in a first memory chip among the memory chips.

5. The memory device of claim 1, wherein the second memory area comprises a plurality of data blocks having the second memory cells and wherein each of the data blocks comprises a plurality of memory blocks.

6. The memory device of claim 5, further comprising a random access memory (RAM) storing a least recently used (LRU) table comprising a plurality of LRU units,
wherein the LRU units are linked in an order corresponding to update times, and
wherein the controller, where a unit of write data is temporarily stored in the first memory area, identifies a data block corresponding to a logical address of the temporarily stored write unit and updates an LRU unit of the identified data block in the LRU table.

7. The memory device of claim 6, wherein the controller selects at an LRU unit having an oldest update time among the LRU table, and wherein where a logical address of the second unit of write data indicates a data block which the selected LRU unit indicates, the controller loads the second unit of write data to the RAM.

8. The memory device of claim 7, wherein the controller is configured to store the second unit of write data loaded to the RAM in a data block corresponding to a logical address of the first unit of write data together with the first unit of write data where the data block which the selected LRU unit indicates coincides with the data block corresponding to a logical address of the first unit of write data.

9. The memory device of claim 1, wherein a type of the first unit of write data is hot data and a type of the second unit of write data is cold data.

10. The memory device of claim 1, wherein a type of the first unit of write data is random data and a type of the second unit of write data is sequential data.

11. The memory device of claim 1, wherein the migration operation is performed according to a remaining storage capacity of the first memory area.

12. A method of controlling a nonvolatile memory comprising a first memory area having first memory cells configured to store single-bit data and a second memory area having second memory cells configured to store multi-bit data, the method comprising:
temporarily storing a first unit of write data from a controller to the first memory area according to a type of the first unit of write data;
migrating the temporarily stored first unit of write data to the second memory area; and
directly storing a second unit of write data from the controller to the second memory area according to a type of the second unit of write data,
wherein migrating the first unit of write data comprises migrating the temporarily stored first write unit to the second memory area when the second write unit is directly stored.

13. The method of claim 12, wherein the second memory area comprises a plurality of data blocks having the second memory cells,
wherein each of the data blocks comprises a plurality of memory blocks, and
wherein a physical address corresponding to a logical address of the first unit of write data and a physical address corresponding to a logical address of the second unit of write data indicate one data block.

14. The method of claim 13, wherein the controller is configured to sequentially write the first and second units of write data in a memory block of the one data block.

15. The method of claim 12, wherein the second memory area comprises a plurality of memory chips having the second memory cells,
wherein the memory chips are concurrently accessed through a plurality of channels,
wherein migrating the first unit of write data comprises storing the temporarily stored first unit of write data in a first memory chip among the memory chips, and wherein directly storing the second unit of write data comprises storing the second write unit in a second memory chip among the memory chips.

* * * * *